United States Patent

[11] 3,602,984

[72] Inventor Robert L. Trent
Marblehead, Mass.
[21] Appl. No. 672,388
[22] Filed Oct. 2, 1967
[45] Patented Sept. 7, 1971
[73] Assignee The United States of America as represented by the Administration of the National Aeronautics and Space Administration

[54] METHOD OF MANUFACTURING SEMICONDUCTOR DEVICES USING REFRACTORY DIELECTRICS
9 Claims, 4 Drawing Figs.

[52] U.S. Cl. .......... 29/578, 29/589, 148/187
[51] Int. Cl. .......... B01j 17/00, H01l 5/00
[50] Field of Search .......... 29/577, 589–591, 578; 148/187; 317/435, 46.5

[56] References Cited
UNITED STATES PATENTS

| | | | |
|---|---|---|---|
| 3,388,000 | 6/1968 | Waters et al. | 148/187 |
| 3,455,020 | 7/1969 | Dawson et al. | 148/187 |
| 3,484,313 | 12/1969 | Tauchi et al. | 148/187 |
| 3,511,724 | 5/1970 | Ohta | 148/187 |
| 3,381,183 | 4/1968 | Turner et al. | 29/577 |
| 3,404,451 | 10/1968 | So | 29/577 |
| 3,426,254 | 2/1969 | Bouchard | 29/577 |
| 3,436,279 | 4/1969 | Klein | 29/577 |

*Primary Examiner*—John F. Campbell
*Assistant Examiner*—W. Tupman
*Attorneys*—John R. Manning, L. D. Wofford, Jr. and G. J. Porter

ABSTRACT: This disclosure is to a process for making semiconductor devices having refractory dielectrics as diffusant masks and interconnection insulations and the resulting structures. The refractory dielectric is deposited onto a semiconductor wafer and an aperture is created that extends through the dielectric to the wafer. An impurity is then diffused into the wafer at the aperture's location and a semiconductor junction is created. In this manner one embodiment of the disclosed structure is formed. If desired, further junctions can be created by applying a second deposition of the refractory dielectric and then performing further aperture creating and impurity diffusing operations. Alternatively, a thermally-grown dielectric can be grown in the first aperture and a second aperture can be created through the thermally-grown dielectric. A further impurity is then diffused into the wafer at the second aperture's location.

INVENTOR
Robert L. Trent

BY

ATTORNEYS

METHOD OF MANUFACTURING SEMI-CONDUCTOR DEVICES USING REFRACTORY DIELECTRICS

The invention described herein was made by an employee of the United States Government and may be manufactured and used by or for the Government for governmental purposes without the payment of any royalties thereon or therefor.

BACKGROUND OF THE INVENTION

Prior art planar and monolithic semiconductor structures are created by forming a thermally grown film of silicon dioxide on a semiconductor wafer of one type of conductivity. An aperture that passes through the film to the wafer is then created. An appropriate impurity is then diffused into the wafer at the aperture and creates a region of opposite conductivity to the conductivity of the wafer resulting in the formation of a P/N junction. If further junctions are desired a second film of silicon dioxide is thermally grown and a second aperture is created. A second impurity is then diffused into the first impurity to create a region of conductivity similar to the conductivity of the wafer, thereby forming a PNP semiconductor device, for example. If further junctions are desired, the process is repeated. In this manner, numerous types of semiconductor structures have been created such as planar diodes and double-diffused transistors, for example. In addition, monolithic semiconductor microelectronic structures are formed in this manner.

While the foregoing process and the resulting structures have found widespread use, they have not always been entirely satisfactory. Specifically, the use of silicon dioxide as the dielectric film has certain disadvantages. More specifically, when silicon dioxide is used, gallium cannot be diffused into the structure to create conductivity regions because gallium reacts with silicon dioxide. Moreover, for the same reason the wafer cannot be formed of gallium arsenide or gallium phosphide. That is, because gallium reacts with silicon dioxide, gallium compounds cannot be used to form the wafer. In addition, silicon dioxide layers are rather thick and therefore prevent the formation of true planar structures. Finally, silicon dioxide has poor thermal properties when compared with other dielectrics, such as refractory dielectrics, for example.

Therefore, it is an object of this invention to provide a new and improved process for making planar and monolithic semiconductor devices.

It is also an object of this invention to provide methods of making semiconductor devices that use a refractory dielectric as the diffusant mask and interconnection insulation.

It is another object of this invention to provide methods of manufacturing semiconductor devices that use both refractory dielectrics and thermally grown dielectrics as diffusant masks and interconnection insulations.

It is also an object of this invention to provide a process for making planar and monolithic semiconductor devices that includes the use of gallium as an acceptor impurity.

It is yet another object of this invention to provide new and improved semiconductor devices that employ refractory dielectrics as diffusant masks and interconnection insulations.

It is a further object of this invention to provide new and improved semiconductor devices employing dielectrics that have improved thermal properties.

It is a still further object of this invention to provide planar and monolithic semiconductor devices employing wafers of gallium arsenide or gallium phosphide.

It is still another object of this invention to provide new and improved monolithic and planar semiconductor devices that use gallium as an acceptor impurity.

SUMMARY OF THE INVENTION

In accordance with a principle of this invention, a new and improved process for creating semiconductor structures is provided. A wafer of semiconductor material of one type of conductivity has a thin layer of a refractory dielectric deposited on one surface, and an aperture is created through the layer to the wafer. An impurity is then diffused into the wafer in the region exposed by the aperture to create a P/N junction. Contacts are applied to the two regions to create a novel planar diode or other two-region semiconductor device. In addition, prior to the application of the contacts, a second layer of refractory dielectric can be deposited onto the surface of the structure to create a protective cover layer.

In accordance with another principle of the invention, prior to adding the contacts, a second layer of refractory dielectric is deposited over the exposed region and a second aperture is created through it to the area of first diffusion. A second impurity is diffused into the exposed region to create a PNP structure, for example. Contacts are then formed to all three regions and a protective cover dielectric layer may be added.

Alternatively, the second layer may be formed of a thermally grown dielectric rather than a refractory dielectric. This thermally grown dielectric is grown in the exposed region and an aperture is created through it. A second impurity is diffused into the newly exposed region to create the resulting PNP structure. Again, contacts are formed to all three regions and a cover dielectric layer may be added.

It will be appreciated by those skilled in the art and others that the use of refractory dielectrics results in improved semiconductor structures. The use of refractory dielectrics allow gallium to be used as an acceptor impurity to create regions of "P" type conductivity. In addition, gallium arsenide or gallium phosphide can be used to form the wafer structure. More specifically, thermally grown or deposited dielectrics such as silicon dioxide, for example, have prevented the use of gallium as an impurity and have prevented the use of gallium compounds as the wafer material. The use of a refractory dielectric such as silicon nitride allows gallium to be used both as an impurity and as a part of the wafer material. Moreover, the use of refractory dielectrics as diffusant masks and interconnection insulations results in semiconductor devices that have improved thermal properties.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENTS

Figure 1:
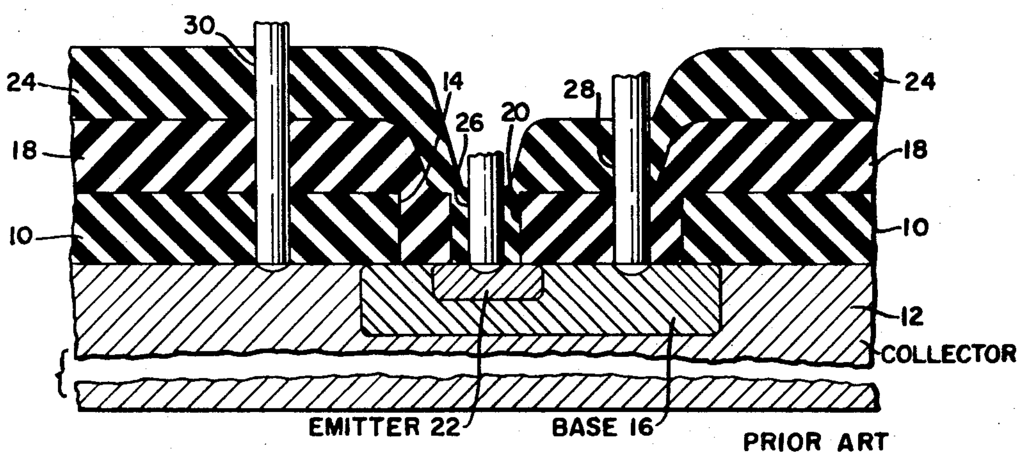
FIG. 1 is a cross-sectional diagram of double-diffused transistor prior art structure formed by prior art processes.

In order to more readily compare the novel features of the invention with the prior art, a prior art double-diffused silicon transistor utilizing thermally grown silicon oxide masking is illustrated in FIG. 1. After normal surface preparation (i.e., lapping, etching and cleaning), the first step in forming a prior art double-diffused transistor is to produce a first silicon dioxide ($SiO_2$) layer 10 on a wafer 12. The wafer 12 is the collector and may be formed of N-type silicon, for example. The silicon dioxide layer 10 is thermally grown on the top surface of the wafer as illustrated in FIG. 1.

Following the formation of the first silicon dioxide layer 10 and aperture 14 is formed in the layer by conventional procedures. For example, the layer may be coated with photoresist, cured, exposed, and developed. The undeveloped photoresist is then removed by normal procedures. Thereafter, the layer is etched. The configuration of the aperture 14 defines a base region 16 for the transistor.

When a wafer prepared in the manner described above is exposed to certain diffusant materials for well-known temperatures and times, the impurity will penetrate into the exposed portion of the silicon wafer 12. If the impurity is of a suitable conductivity type, the conductivity of the silicon can be locally inverted to form a junction. This process is termed "masked diffusion" The undermask penetration of the impurity region is approximately equal to the vertical penetration, with certain modifications depending upon the relative affinity of the impurity towards either the oxide phase or the pure phase of silicon.

The impurity element most frequently employed to form P-type base regions in N-type silicon wafers is boron. Normally, boron is used in various compound forms such as: solid $B_2O_3$, liquid $BCl_3$, or $BBr_3$, and gaseous $B_2H_6$. It should be noted that it has been impractical to employ gallium impurities to create the P region because the gallium atoms rapidly diffuse through the silicon dioxide masking layer 10.

During or following the diffusion step creating the base region and forming the base-collection junction, there is formed a second silicon dioxide layer 18. This second silicon dioxide layer 18 is contiguous with the first layer 10 and extends into the aperture 14 in the first layer. More specifically, this second layer or mask 18 extends the oxide coating over the entire top surface of the heretoformed structure to insure that the aperture 14 in the first layer is completely covered. As hereinafter described, completely covering the aperture allows an emitter region to be created in the base region that does not extend to the extremities of the base region. If the emitter is extended to the extremities of the base region, it could adversely affect the junction characteristics of the device.

A second aperture 20 is formed in the second layer in a manner similar to the formation of the first aperture 14 in the first layer and described above. This aperture is formed over the base region and, hence, the second silicon dioxide layer 18 masks the base region.

Following the formation of the aperture 20 in the second silicon dioxide layer 18, an emitter region of opposite conductivity to the base region is formed in the base region. For example being used, the emitter region is N-type and it is created by disposing a suitable impurity or alloy thereof atop the base layer in the apertures' region. The element most frequently employed is phosphorous in alloy form; suitable alloys of phosphorous are: solid $P_2O_5$, liquid $POCl_3$ or $P_4N_3$, and gaseous $PH_3$. After the alloy has been disposed atop the base region, the wafer is heated and the impurity diffuses into the base to form the emitter region 22. Hence, a base-emitter junction is formed between the base region and the emitter region. The junction between the base and emitter regions terminates at the upper surface of the wafer beneath the second mask 18 of silicon dioxide.

During or following the emitter diffusion step, a third layer 24 of silicon dioxide is formed over the wafer. This layer is the protective cover layer and is primarily intended to cover the exposed emitter region but normally covers the entire surface of the wafer structure.

Following the formation of the third silicon dioxide layer 24, three apertures are created through the various oxide layers so that contacts can be made with the three regions of the double-diffused transistor structure. These apertures are created by the process described above. That is, the surface is coated with photoresist, cured, exposed and developed. The undeveloped photoresist regions are then removed and the layer is etched. The first aperture 26 is formed through only the third layer 24 and extends to the emitter region 22. The second aperture 28 is formed through the second layer 18 and the third layer 24 and extends to the base region 16. The third aperture 30 extends through all three layers to the collector region 12. Following the creation of the three contact apertures, ohmic contacts are formed through the apertures to their respective regions.

While the foregoing has described a process for creating an NPN transistor, with suitable changes it has also been utilized in the prior art to create PNP transistors, planar diodes and monolithic semiconductor structures. It will be appreciated that prior art devices of the type just described have several disadvantages. Namely, gallium cannot be used as a diffusant to create P regions, nor can gallium compounds be used to form the wafer material because gallium reacts with silicon dioxide. Further, the use of silicon dioxide as a diffusant mask and interconnection insulation results in a structure having less than the most desirable thermal properties when the structure is to be used in a varying environment. However, the novel processes of the invention as hereinafter described result in novel structures of the type illustrated in FIGS. 2, 3 and 4 that overcome either some or all of these disadvantages.

Figure 2:
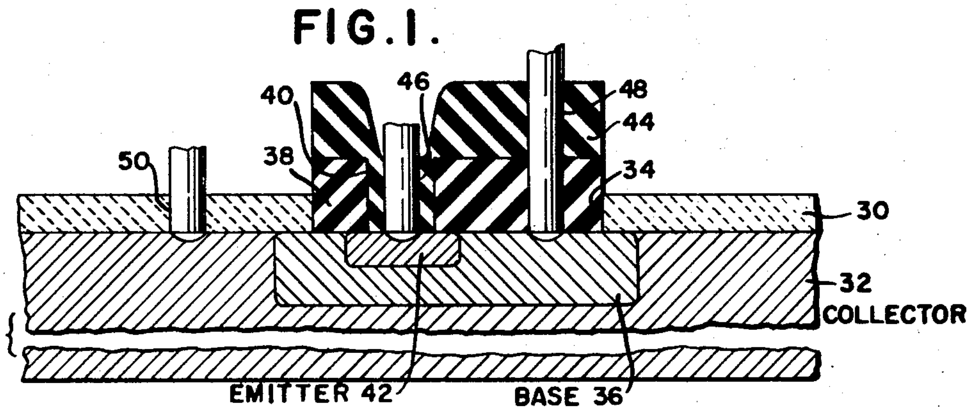
FIG. 2 is a cross-sectional diagram of a double-diffused transistor structure made in accordance with the process of the invention.

Turning now to the process for forming the structure illustrated in FIG. 2, the first step of the process of the invention after normal surface preparation by lapping, etching and cleaning is to produce a refractory dielectric layer 30 on a wafer 32. If desired, prior to the deposition of the refractory layer, the surface of the structure may be cleaned in situ. Depending upon the refractory dielectric material to be deposited, the cleaning procedures may involve vapor cleaning by means of argon bombardment, or electronic particle bombardment. Alternatively, the material may require that HCl or $H_2$ particle cleaning be employed.

For purposes of discussion, the wafer 32 illustrated in FIG. 2 is comprised of N-type silicon. However, it will be appreciated by those skilled in the art that other suitable materials may also be used. Also, for purposes of illustration, silicon nitride ($Si_3N_4$) is the refractory dielectric forming the refractory dielectric layer 30. Again, it will be appreciated by those skilled in the art that other refractory dielectrics such as aluminum oxide ($Al_2O_3$) may also be used.

The relative thickness of the refractory dielectric layer 30 is much thinner than a thermally grown silicon dioxide layer. Specifically, a typical dimension for a refractory dielectric layer is 1,000 A. while a typical dimension for a thermally grown silicon dioxide dielectric layer of the type depicted in FIG. 1 is 15,000 to 20,000 A. The thinner layer is possible because a refractory dielectric is much more impervious to impurity diffusion than is a thermally grown dielectric. Further, the etching rate of a refractory material is much slower than the etching rate of thermally grown material. Typical examples are 150–300 A./second for silicon dioxide and 200–400 A./minute for silicon nitride.

After the silicon nitride layer 30 is deposited onto the silicon wafer 32 by vacuum deposition, for example, an aperture 34 is created in the layer. As with the formation of the apertures in the silicon dioxide layers of FIG. 1, conventional procedures may be used. Specifically, the layer is coated with photo-resist, cured, exposed and developed. Thereafter, the undeveloped photo-resist is removed and the layer is etched. The configuration of the aperture 34 defines a base area 36 for the transistor structure. That is, as with the prior art structures utilizing silicon dioxide layers, the silicon nitride layer forms a mask that protects the wafer 32 where it covers the wafer while leaving an aperture 34 for forming a base region 36 in the wafer.

Following the formation of the aperture 34, the base region is created by diffusing an impurity into the collector wafer 32. This base region can be created by diffusing boron into the wafer in the manner described above with respect to FIG. 1.

After boron has been used to create the P-type base region or while it is being used to create the P-type base region, there is formed a silicon dioxide mask 38 over the base region 36 inside of the aperture 34 of the refractory dielectric layer 30. That is, the silicon dioxide masking layer 38 is contiguous with the refractory dielectric layer but only in the aperture formed in the refractory dielectric layer. Hence, the silicon dioxide mask re-extends the protective coating over the top surface of the silicon wafer and insures that the second material thereafter diffused into the wafer forms an emitter region 42 that does not extend beyond the extremities of the base region 36 to adversely affect the junctions.

By conventional means similar to those described above with respect to FIG. 1, a second aperture 40 is formed in the thermally grown silicon dioxide masking layer 38. The configuration of the second aperture determines the configuration of the emitter region 42.

Following the formation of the second aperture 40, a suitable material, such as phosphorous, is diffused into the base region to create the emitter region 42. Hence, an emitter-base junction is formed having a terminus at the upper surface of the base region beneath the silicon dioxide layer 38. The alloy of phosphorous used may be any of those described above.

During or following the second diffusion cycle a second thermally grown silicon dioxide layer 44 is formed over the exposed emitter aperture 40 and the exposed surface of the first silicon dioxide layer 38.

Following the formation of the second silicon dioxide layer 44, three contact apertures are formed. Specifically, an emitter contact aperture 46 is created through only the second silicon dioxide layer 44 to the emitter 42. A base contact aperture 48 is created through the first and second silicon dioxide layers to the base region 36. And, a collector contact aperture 50 is created through only the refractory dielectric layer 30 to the collector region 32. In order to preclude problems of undercutting because of the different order of magnitude of etching times involved in etching through refractory dielectrics versus thermally grown oxides, it is expeditious to employ two photo-resist masking steps. One step masks against etching any apertures except the one required through the refractory dielectric and one step masks against etching any apertures except the two required through the silicon dioxide layers.

After the apertures are formed, ohmic contacts are made to the various regions of the double-diffused transistors by any conventional method.

It will be appreciated that the number of layers of dielectrics (either oxide or refractory) over prior art devices has been decreased in the device illustrated in FIG. 2 and formed by the process hereinabove described. This means that the length of the interconnecting paths between the wafer and the surface of the dielectric layers is shorter resulting in a reduced possibility of interconnection path failure.

While the novel embodiment of the invention illustrated in FIG. 2 and formed by the novel process described above has certain advantages over the prior art, it also has certain disadvantages. Specifically, the structure illustrated in FIG. 2 has the advantage of a thin dielectric layer over a major portion of the surface of the semiconductor wafer. This layer has thermal properties that are better than prior art devices that use silicon dioxide to form a similar layer. In addition, even at the surface of the emitter and base regions, the dielectric layer is thinner than prior art structures. However one of the disadvantages of the embodiment illustrated in FIG. 2 is that gallium cannot be used as an impurity because silicon dioxide forms a portion of the dielectric layer. That is, gallium cannot be used as an impurity to form a region of P-type conductivity nor can gallium compounds be used to form the wafer material. However, the embodiment of the invention illustrated in FIGS. 3 and 4 and formed by the processes hereinafter described can utilize gallium either as an impurity or as the wafer material. The use of gallium as an impurity will be described with respect to FIG. 3 and the use of a gallium compound to form the wafer will be described with respect to FIG. 4, but it is to be understood that they can be interchanged.

Figure 3:
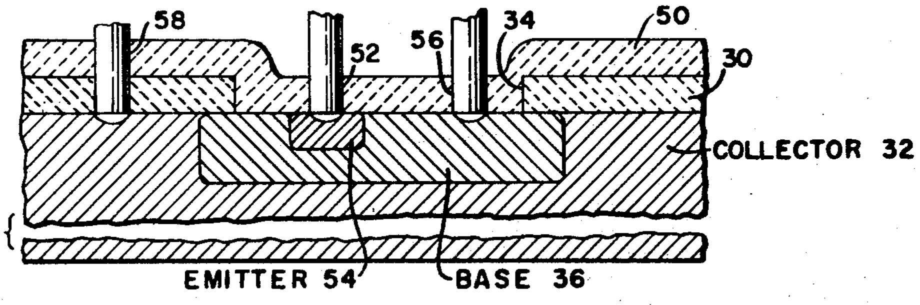
FIG. 3 is a cross-sectional diagram of a double-diffused transistor made in accordance with an alternative process of the invention.

Since the steps for forming the first dielectric layer 30 over the surface of the wafer 32 of semiconductor material are the same for the structure of FIG. 3 as they were for the structure of FIG. 2, they will not be discussed.

After refractory dielectric layer 30 has been formed over the surface of the N-type silicon wafer 32, the first aperture 34 is formed therein. Thereafter, gallium is diffused into the N-type collector region 32 to form the P-type base region 36. As is well known in the art, because gallium is used as the impurity, it is necessary to subject the aperture 34 to a thermal oxidation process to afford protection against pitting of the surface. However, the use of a refractory dielectric restricts the growth of the thermally grown oxide to the aperture area. And, such thermally grown oxide after it has been employed in the diffusion process can be removed by etching without necessitating the repetition of the photo-resist, masking steps described above. This can be done without those steps because of the high differential etching rate between refractory dielectrics and thermally grown silicon dioxide.

Following the diffusion step and the removal of the thermally grown oxide step, a second refractory dielectric layer 50 is formed over the first refractory dielectric layer 30. The second layer completely covers the first aperture 34 as well as the first dielectric layer 30.

By the steps hereinabove described a second aperture 52 is formed in the second refractory dielectric layer 50.

Following the creation of the second aperture 52, an impurity such as phosphorous is diffused into the base region 36 to create an emitter region 54 and, hence, an emitter-base junction is created.

During or following the diffusion cycle that creates the emitter region, there is formed a thermally grown silicon dioxide masking layer over the exposed emitter region.

Following the creation of the silicon dioxide masking layer, three contact apertures are formed through the dielectric layers of the structure. Suitable masking and etching procedures are followed to create: an emitter contact aperture 52 through the last formed silicon dioxide layer only to the emitter region; a base contact aperture 56 through the second layer of refractory dielectric only to the base region; and a collector contact aperture 58 through both the first and second refractory dielectric layers to the collector region.

Following the creation of the contact apertures, suitable steps are taken to form ohmic contacts with the emitter, base and collector regions of the transistor through the apertures.

Figure 4:
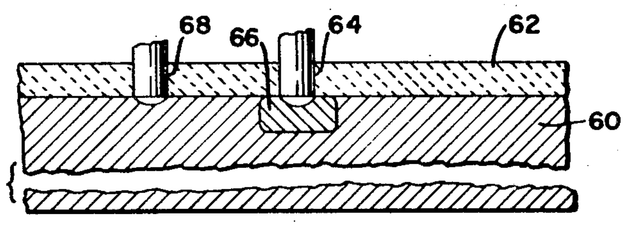
FIG. 4 is a cross-sectional diagram of a planar diode made in accordance with the process of the invention.

It should be noted that because the third aperture 58 must be formed through the two refractory dielectric layers, a portion of it could be formed prior to the creation of the complete aperture. Specifically, it is expeditious at the time of creating the first aperture 52 that forms an opening for the creation of the emitter region 54, to create a portion of the third contact aperture 58. Because there are two thicknesses of refractory dielectric at the location of the collector aperture 58, if a portion of it is etched at the time the emitter diffusion aperture is formed the portion will not extend to the surface of the wafer and thus the collector will not be exposed to emitter diffusion. However, the dielectric protection will be reduced to a point where subsequent etching procedures will be balanced. FIG. 4 illustrates a two region semiconductor device wherein the inventive process allows the wafer to be a gallium compound. The device could be a planar diode, for example. The device illustrated in FIG. 4 generally comprises a wafer structure 60 formed of gallium arsenide or gallium phosphide, for example. The wafer is appropriately doped to give it one type of conductivity, either N or P. A layer of refractory dielectric 62 is formed over the wafer after appropriately cleaning the surface of the wafer in the manner hereinabove described. Following the formation of the refractory dielectric layer, an aperture 64 is created in the layer also in the manner hereinabove described. A suitable impurity is then diffused through the aperture 64 into the wafer 60 to create a region 66 of opposite conductivity to the wafer region. Following the formation of the opposite conductivity region 66, an ohmic contact is made to that region through the aperture 64. A second ohmic contact is made to the wafer region through a further aperture 68 formed through the dielectric layer 62. Alternatively the second contact 68 could be made to the bottom of the wafer 60 as viewed in FIG. 4.

The foregoing has described various processes for forming novel semiconductor structures. The inventive processes allow gallium to be used as the impurity which was not the case with prior art processes when silicon dioxide was used as the diffusant mask and interconnection insulation. Further, gallium compounds can now be used to form the wafer structure. Moreover, the use of a refractory dielectric as the diffusant mask and interconnection insulation results in the formation of semiconductor devices that have better thermal properties than prior art devices. In addition, the devices formed are thinner.

It will be appreciated that the structures illustrated in FIGS. 2–4 are merely exemplary of the type of structures that can be created by the processes of the invention. In addition to transistor and diode devices, numerous other semiconductor structures such as monolithic circuits can be formed utilizing the processes of the invention. Hence, the invention processes can be practiced to form other structures than those specifically disclosed herein. Further, numerous modifications of the processes of the invention will be obvious to those skilled in the art. Consequently, the invention may be practiced otherwise than as specifically described herein.

What is claimed is:

1. A method of making transistor semiconductor devices comprising the steps of:

depositing a first layer of a refractory dielectric onto the surface of a wafer of semiconductor material of a given conductivity type;

creating a first aperture in said first dielectric layer;

diffusing a first type of impurity through said first aperture to form a base region;

thermally growing a second layer of a dielectric material within the confines of said first aperture;

creating a second and a third aperture, said second aperture extending through said thermally grown second layer of dielectric material to form an exposed portion of said region of opposite conductivity and said third aperture extending partially through said first refractory dielectric layer;

diffusing a second type of impurity through said second aperture to form an emitter region;

thermally growing a third layer of a dielectric material within the confines of said first aperture;

creating a fourth, a fifth and a sixth aperture, said fourth aperture extending through said partially formed third aperture to form an exposed portion of a collector region, said fifth aperture extending through said second and third thermally grown dielectric layers to form an exposed portion of said base region and said sixth aperture extending through said third thermally grown dielectric layer to form an exposed portion of said emitter region; and forming ohmic contacts through said fourth, fifth and sixth apertures.

2. The method of claim 1 wherein said second and third thermally grown layers are silicon dioxide.

3. A method of making transistor semiconductor devices comprising the steps of:

depositing a first layer of a refractory dielectric onto the surface of a wafer of semiconductor material of a given conductivity type;

creating a first aperture in said first dielectric layer;

diffusing a first type of impurity through said first aperture to form a base region;

depositing a second layer of a refractory dielectric onto said first dielectric layer;

creating a second and a third aperture in said second layer, said second aperture exposing a portion of said region of opposite conductivity and said third aperture extending only to said first refractory dielectric layer;

diffusing a second type of impurity through said second aperture to form an emitter region;

creating a fourth and a fifth aperture, said fourth aperture extending through said third aperture to form an exposed portion of a collector region and said fifth aperture extending through said second dielectric layer to form an exposed portion of said base region; and forming ohmic contacts through said second, fourth and fifth apertures.

4. A method as claimed in claim 3 wherein said wafer has N-type conductivity and said first impurity is a compound of gallium.

5. A method as claimed in claim 3 wherein said wafer is a compound of gallium.

6. A method as claimed in claim 5 wherein said gallium compound is gallium arsenide.

7. A method as claimed in claim 5 wherein said gallium compound is gallium phosphide.

8. A method as claimed in claim 3 wherein said refractory dielectric layers are silicon nitride.

9. A method as claimed in claim 3 wherein said refractory dielectric layers are aluminum oxide.